US 6,661,286 B2

(12) United States Patent
Filoramo et al.

(10) Patent No.: US 6,661,286 B2
(45) Date of Patent: Dec. 9, 2003

(54) VARIABLE GAIN AMPLIFIER

(75) Inventors: Pietro Filoramo, Siracusa (IT); Tiziano Chiarillo, Ruffano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/075,161

(22) Filed: Feb. 13, 2002

(65) Prior Publication Data

US 2002/0140507 A1 Oct. 3, 2002

(30) Foreign Application Priority Data

Feb. 13, 2001 (IT) ................................. MI2001A000284

(51) Int. Cl.[7] ............................................... H03F 3/45
(52) U.S. Cl. ........................ 330/254; 330/260; 330/259
(58) Field of Search ................................. 327/346, 350, 327/359; 330/254, 260, 259

(56) References Cited

U.S. PATENT DOCUMENTS 4,514,702 A * 4/1985 Zogg ........................... 330/254
5,528,197 A * 6/1996 Frey ............................ 330/254

* cited by examiner

*Primary Examiner*—Steven J. Mottola
(74) *Attorney, Agent, or Firm*—Dennis M. de Guzman; Lisa K. Jorgenson; Seed IP Law Group PLLC

(57) ABSTRACT

A variable gain amplifier is described which comprises a first device to which a first control signal (Vc, Vc1) is applied so that the gain (Ai1, Ai) of an output signal (iout, io) of the first device (11, 22, Q45–Q48) with respect to a first input signal (in, i1, ir) is a function of the exponential type of the first control signal (Vc, Vc1). The amplifier comprises a feedback network (25, Q51–Q58) connected between an output terminal and an input terminal of the first device (22, Q45–Q48) so as to assure that the gain (Ai) in decibel of the first device (22, Q45–Q48) is a linear function of the first control signal (Vc1).

26 Claims, 4 Drawing Sheets

VARIABLE GAIN AMPLIFIER

BACKGROUND OF THE INVENTION

1. Field of the Invention

The present invention relates to a variable gain amplifier, particularly to a radio frequency amplifier.

2. Description of the Related Art

Amplifier circuit structures the gain of which changes in response to the value of an applied control voltage are generally known. A circuit of such type is shown in FIG. 1 where it is possible to distinguish three functional blocks: a voltage/current converter 10, a current divider 11 and a current/voltage conversion load 12. The current divider 11 is typically formed by two transistors Q10, Q20, for example bipolar transistors, in differential stage configuration, which have the emitter terminals connected with each other and coupled to the output of the block 10, the collector terminal of the transistor Q10 is connected with a supply voltage Vcc and the collector terminal of the transistor Q20 is connected with the block 12, while a control voltage Vc is applied at the base terminals of the transistors Q10 and Q20. The amplification gain variation occurs in response to the application of the voltage Vc at the differential couple Q10, Q20; in fact, because of the unbalance due to the application of the voltage Vc at the transistor couple Q10, Q20, a division of the current signal is obtained according to the rule:

$$iout = \frac{in}{1 + e^{\frac{Vc}{Vt}}}$$

wherein iout is the output current of the block 11, in is the input current of the block 11 and Vt is the thermal voltage; in such case if the current gain of the block 11 is indicated by Ai1=iout/in, it is obtained that such gain is a function of the exponential type of the control signal Vc. Indicating with:

$$Av1 = 20 \log\left(\frac{Vout}{Vin}\right)$$

the voltage gain in decibel wherein Vout is the output voltage of the whole circuit and Vin is the input voltage and assuming for example that the block 12 is constituted only by a resistor RL and the relation between Vin and in in the block 10 is Vin=Gm*in wherein Gm is the transconductance gain of the block 10, for voltage values Vc>>Vt it is obtained:

$$AV1 = 20 \log(2GmRL) + k\frac{Vc}{Vt}$$

where K is a constant factor. Therefore the gain Av1 in decibel becomes a linear function of the control voltage Vc.

The condition Vc>>Vt provides operatively to maintain the differential couple Q10, Q20 in high unbalance state, by making the greatest part of the signal current to pass through the electric path connected with the power supply Vcc. This represents a limit of such circuit because the maximum gain is automatically determined when the value of the load RL has been defined and a certain accuracy of the linearity characteristic of the gain curve has been assigned. For increasing the gain in the applications wherein it is required, it is necessary to act on the load RL since the value of the transconductance Gm is fixed on the base of the distortion constraints of the signal; this causes a high reduction of the amplifier band of the amplifier and a high increasing of the thermal noise. Therefore the aforementioned circuit does not result applicable in the cases wherein high gains, high bandwidth and low noise are required.

BRIEF SUMMARY OF THE INVENTION

In view of the state of the art described, it is an object of the present invention to form a variable gain amplifier that overcomes at least in part the aforementioned limitations.

According to the present invention, such object is attained by a variable gain amplifier comprising a first device to which a first control signal is applied so that the gain of an output signal of said first device with respect to a first input signal is a function of the exponential type of said first control signal, characterized by comprising a feedback network connected between an output terminal and an input terminal of said first device so as to assure that said gain in decibel of said first device is a linear function of said first control signal.

Thanks to the present invention it is possible to form a variable gain amplifier that can be utilized in application requiring contemporaneously high gain, low noise and high bandwidth.

BRIEF DESCRIPTION OF THE SEVERAL VIEWS OF THE DRAWINGS

The features and the advantages of the present invention will be made evident by the following detailed description of an embodiment thereof, illustrated as not limiting example in the annexed drawings, wherein.

DETAILED DESCRIPTION OF THE INVENTION

Figure 1:
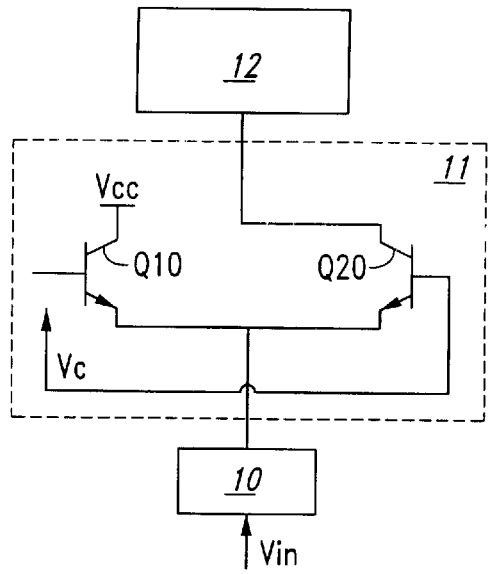
FIG. 1 is a circuit scheme of a variable gain amplifier according to prior art.
Figure 2:
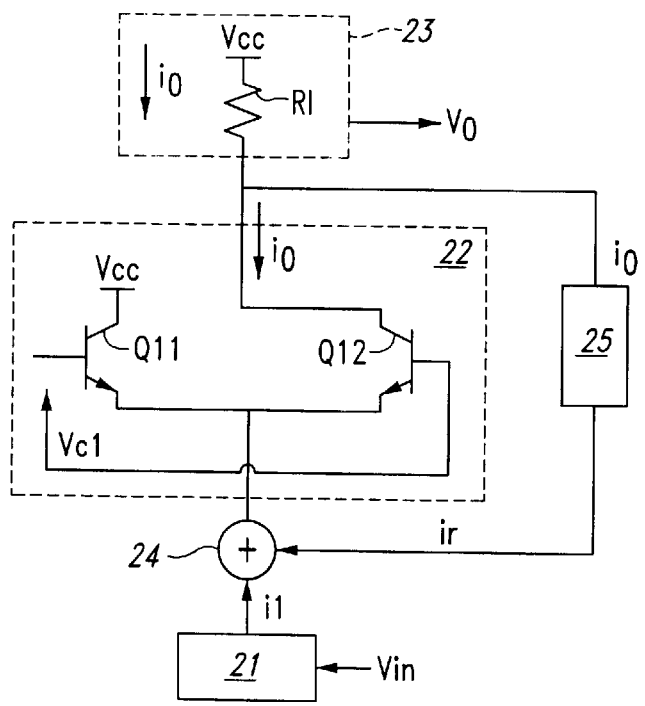
FIG. 2 is a circuit scheme of a variable gain amplifier according to invention.

Referring to FIG. 2 a variable gain amplifier according to invention is described. The amplifier in FIG. 2 comprises different functional blocks: a voltage/current converter 21 adapted to convert a voltage signal Vin into current, a current divider 22 and a current/voltage conversion load 23 adapted to converter an input current io into an output voltage Vo. The blocks 21, 22 and 23 are connected in series.

At a node 24 an output current i1 of the block 21 is added to an output current ir of the block 25 constituted by a feedback network having in input the output current io of the block 22. Imposing the equilibrium of the currents at the node 24 it is obtained:

$$io + io^* \exp(Vc1/Vt) = i1 + ir$$

where ir is the estimated value of the output current, Vt is the thermal voltage and Vc1 is the control voltage acting between the base terminals of the transistors Q11 and Q12 of the current divider 22. Since the feedback network 25 makes ir equal to io, it is obtained:

$$io = i1^* \exp(-Vc1/Vt).$$

Considering the current gain Ai=io/i1 it is obtained that the gain Ai in decibel is a linear function of the control voltage Vc1. Both the currents i1 and io are sum of two components, this is a bias current and a signal current and thus it is possible to derive a bias component given by:

$$Io = I1 * \exp(-Vc1/Vt),$$

and a signal component given by:

$$ios = i1s * \exp(-Vc1/Vt).$$

Once the voltage Vc1 has been fixed, the current division effect is equal both for the bias current and for the signal current. Therefore the feedback network can be formed so that only the bias component is the utile information thereto.

Figure 3:
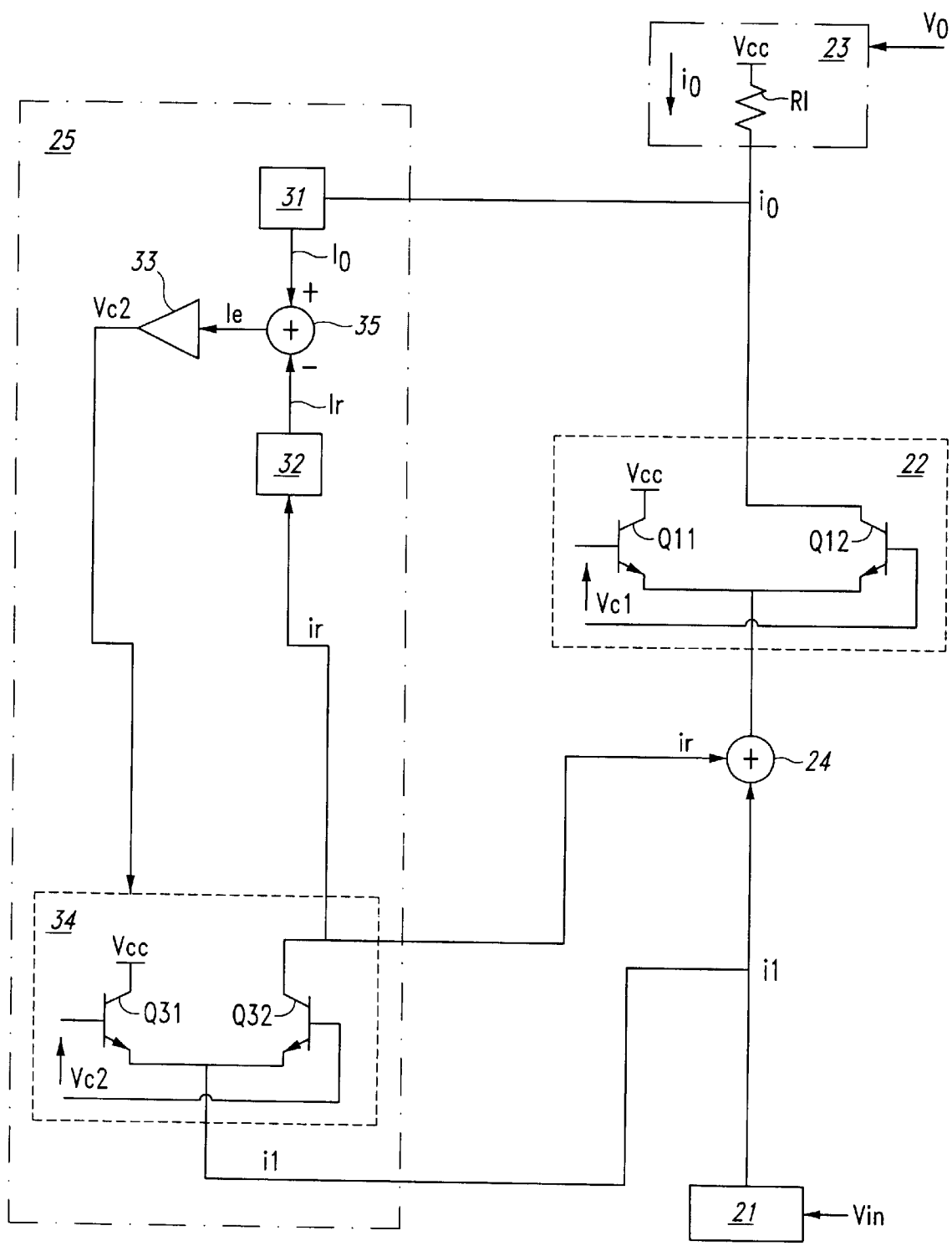
FIG. 3 is a more detailed circuit scheme of the variable gain amplifier in FIG. 2.

In FIG. 3 the variable gain amplifier of FIG. 2 is described wherein the feedback network 25 reacts only to the information of the bias current but acts combining both the components of bias and signal current at the node 24. The currents io and ir are sent to the respective blocks 31 and 32 which allow to extract the continuous component of the currents io and ir. Such blocks may be constituted by low pass filters or, in the case of differential structures, network sensitive only to the common mode signal. The continuous components of the current io and ir which output from the blocks 31 and 32, this is the current Io and Ir, are sent to the sum node 35; the current Ie given by Ie=Io−Ir is sent to the input of a operational amplifier 33 able to generate an output voltage signal Vc2 proportional to the current Ie.

The voltage signal Vc2 is sent to a voltage divider 34 where it is utilized as control signal and is applied at the base terminals of two npn bipolar transistors Q31 and Q32 arranged in differential configuration. The transistors Q31 and Q32 receive in input at the common emitter terminal the current i1 and the block 34 generates an output current ir sent in turn in input to the block 32 and to the sum node 24. The amplifier in FIG. 3 does not react to the signal component and this allows to obtain a higher bandwidth of the amplifier.

Figure 4:
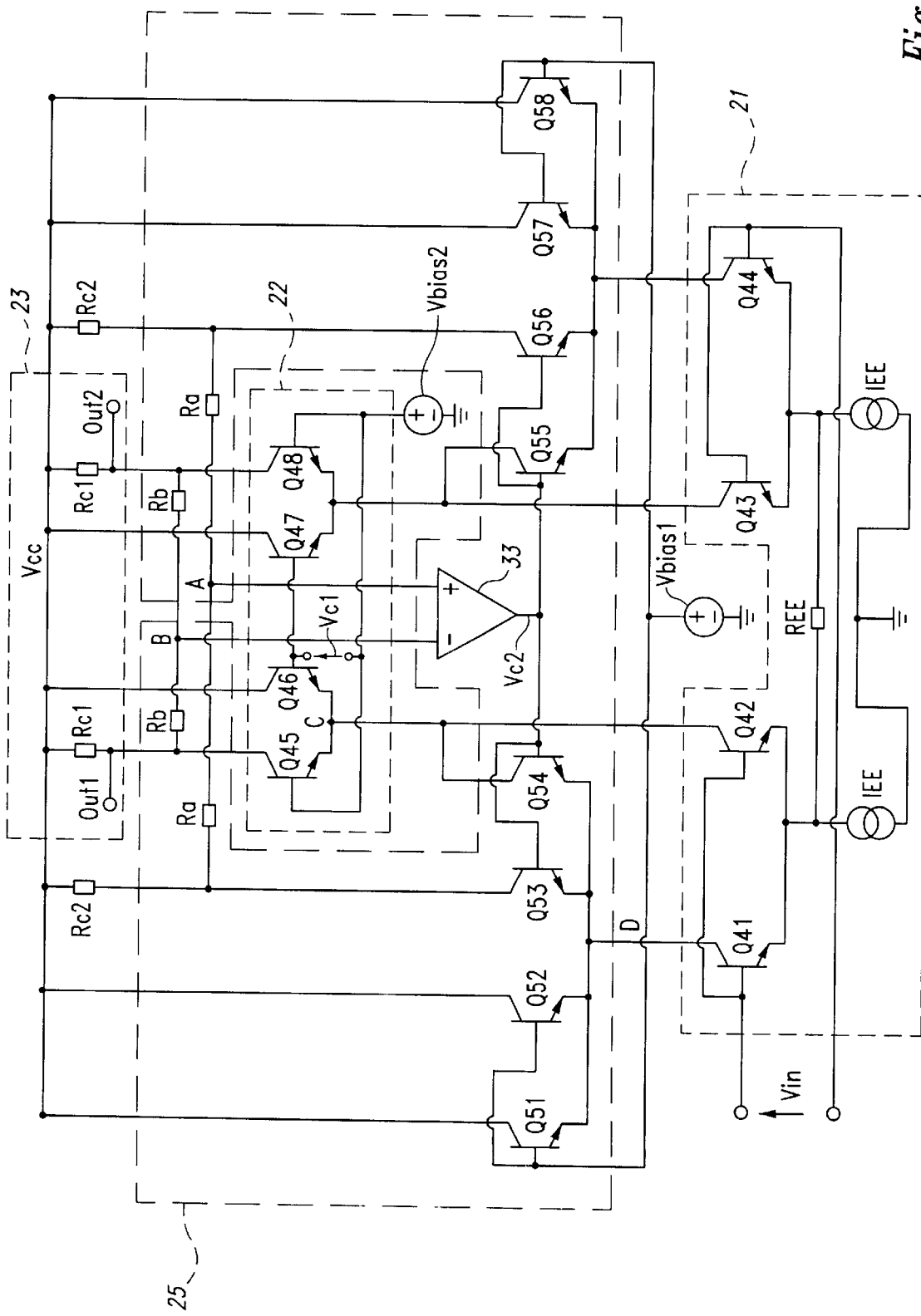
FIG. 4 is a circuit scheme of a circuit implementation of the variable gain amplifier in FIG. 3.

In FIG. 4 an implementation circuit scheme of the structure shown in FIG. 3 is described. The circuit structure shown is totally differential in order to make the circuit more immune to the disturbances.

The block 21 comprises a first couple of npn bipolar transistor Q41, Q42 having the emitter terminals connected with each other and with a first current generator IEE, and a second couple of npn bipolar transistor Q43, Q44 having the emitter terminals connected with each other and with a second current generator IEE. The common emitter terminals of the transistor couples Q41, Q42 and Q43, Q44 are connected at the terminals of a resistor REE and a voltage signal Vin is applied between the base terminals of such transistor couples.

The block 22 comprises a first couple of npn bipolar transistors Q45, Q46 arranged in differential configuration and which have the emitter terminals in common at the node C and are connected with the collector terminal of the transistor Q42, and a second couple of npn bipolar transistors Q47, Q48 arranged in differential configuration and which have the emitter terminals in common and are connected with the collector terminal of the transistor Q43. The control voltage Vc1 is applied at the base terminals in common of the transistors Q45, Q47 and of the transistors Q45, Q48 and a bias voltage Vbias2 is applied only at the base terminals in common of the transistors Q45, Q48. The collector terminals of the transistors Q46, Q47 are connected with the supply voltage Vcc while the collector terminals of the transistors Q45 and Q48 are connected with two resistors Rc1 connected both with the supply voltage Vcc and which form the block 23. The collector terminals of the transistors Q45 and Q48 are the output terminals Out1 and Out2 of the amplifier and are connected with two resistors Rb which have the other terminal B in common.

The block 25 comprises a first transistor group constituted by couples of npn bipolar transistors Q51, Q52 and Q53, Q54 arranged in differential configuration and a second transistor group constituted by couples of npn bipolar transistors Q55, Q56 and Q57, Q58 arranged in differential configuration. The emitter terminals in common of the first group are connected at node D with the collector terminal of the transistor Q41 while the emitter terminals in common of the second group are connected with the collector terminal of the transistor Q44. The base terminals of the transistors Q51, Q52 and Q57, Q58 are connected with a bias voltage generator Vbias1 and the collector terminals are connected with the supply voltage Vcc. The collector terminals of the transistors Q54 and Q55 are connected respectively with the collector terminals of the transistors Q42 and Q43 while the collector terminals of the transistors Q53 and Q56 are connected with respective resistors Rc2 connected with the supply voltage Vcc and are connected with respective resistors Ra having a terminal A in common.

The terminals A and B are the input terminals of the operational amplifier 33, respectively the not inverting input and the inverting input. The output terminal of the operational amplifier 33 is connected with the common base terminals of the transistors Q53, Q54 and Q55, Q56.

The operational amplifier 33 detects a common mode voltage Vm by means of the terminal B and, for the feedback, generates in output the voltage Vc2 so that the voltage at the terminal A is next the voltage at the terminal B. Once that the rate between the resistors Rc2 and Rc1 has been fixed equal to that of the areas of the transistors Q53 and Q54 it is obtained that the bias currents of the transistors Q53 and Q54 are equal.

Since the feedback network 25 reacts only to the common mode signal Vm, the information utile for the reaction is only the bias current of the load. For achieving the relation between the voltages Vc1 and Vc2 it is possible to study the circuit without the input signal, this is with Vin=0.

Imposing the equilibrium of the currents at the node C it is obtained:

$$I45 = \frac{I54 + IEE/2}{1 + \exp(Vc1/Vt)}$$

wherein the currents I45 e I54 are bias collector current of the transistors Q45 and Q54. Since I45=I54 it is obtained:

$$I45 = \frac{IEE}{2} * \exp\left(-\frac{Vc1}{Vt}\right).$$

Imposing the equilibrium of the currents at the node D it is obtained:

$$I45 = \frac{\frac{IEE}{2} * \left(\frac{n}{n+1}\right)}{1 + \exp(Vc2/Vt)}$$

wherein n is the rate between the resistors Rc2 and Rc1 which is equal to the rate of the areas of the transistors Q51–Q52, Q54–Q53, Q55–Q56, Q58–Q57. Combining together the preceding equations it is obtained:

$$Vc2 = Vt \ln\left[\frac{n}{n+1} * \exp\left(\frac{Vc1}{Vt}\right) - 1\right].$$

wherein in order to achieve a valid expression it is necessary to have $Vc1 \geq Vt*\ln[n/(n+1)]=Vc1min$. If $Vc1=Vc1min$ the differential stage formed by transistors Q51–Q54 is totally unbalanced and therefore, by reducing Vc1 under the value Vc1min, the transistor Q54 does not provide a current equal to that flowing through the load, and this determines a consequent linearity loss of the curve of the gain Av in decibel to the variation of the applied control voltage Vc1. Therefore in the circuit design it is necessary to reduce the most possible the Vc1min to have higher gains Av with an equal accuracy of the curve of the gain Av in decibel; this comports the need to fix n>>1 for achieving Vc1min next zero.

Imposing the equilibrium of the currents at the nodes C and D in normal management state of the amplifier, this is with Vin#0, it is obtained:

$$i45 = \frac{i54 + i42}{1 + \exp(Vc1/Vt)} \quad e \quad i54 = \frac{\frac{n}{n+1}*i41}{1 + \exp(Vc2/Vt)}$$

wherein i45, i54, i42, i41 are the collector currents of the transistors Q45, Q54, Q42, Q41. Since Vc2 depends on Vc1 as shown in a preceding equation, it is obtained: $i54=i41*\exp(-Vc1/Vt)$. Since $i41=i42$ and considering the preceding equations it is obtained:

$$i45 = i41 * \exp(-Vc1/Vt).$$

Since $Vout=2*Rc1*io$, $i41=Gm*Vin$ e $Av=20\log(Vout/Vin)$ wherein Vout is the output voltage of the amplifier, Gm is the transconductance gain of the block 21 it is obtained:

$$Av=20\log(2*Gm*Rc1)+KVc1/Vt$$

wherein k is a constant value and Vc1 is such that $Vc1 \geq Vt*\ln[n/(n+1)]$.

The amplifier in FIG. 4 is not sensitive to eventual offsets of the operational amplifier 33; in fact when the gain Av is low, this is when the offset of the operational amplifier 33 has a greater weight because it becomes similar to the voltage Vout of the load, the correction effect of the reaction with respect to the linearitation of the gain curve is negligible because with $Vc1>>Vt$ it is obtained that $1+\exp(Vc1/Vt) \approx \exp(Vc1/Vt)$.

Figure 5:
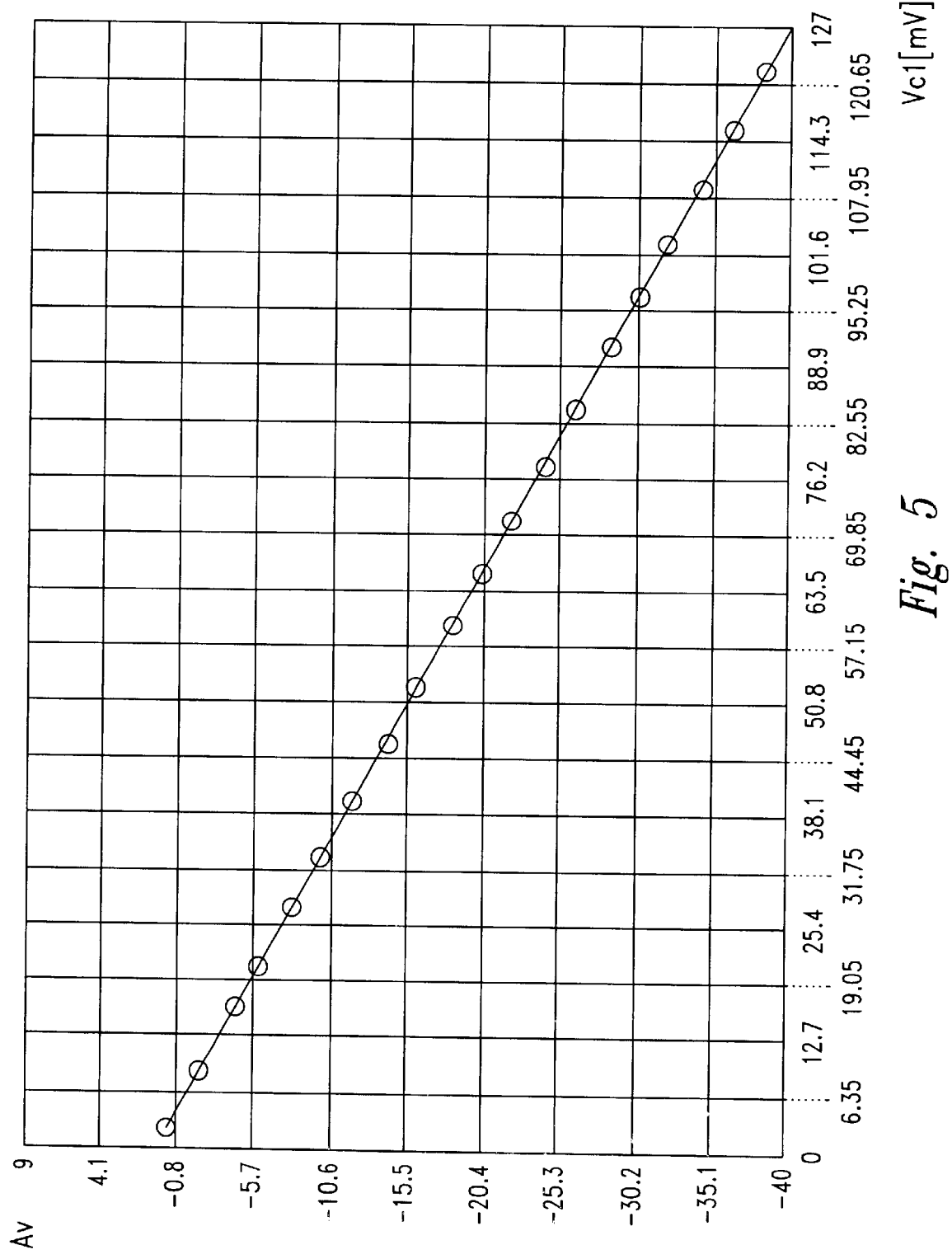
FIG. 5 is a diagram of the voltage gain of the circuit in FIG. 4 in function of the control voltage.

In FIG. 5 a diagram of the voltage gain Av (in decibel) of the amplifier in FIG. 4 in function of the control voltage Vc1 is shown in the case wherein the amplifier has a gain range of 40 dB, a maximum gain of 0 dB, a linearity accuracy of the gain curve of 1 dB.

Even if bipolar transistors has been used in the amplifier shown in the FIGS. 1–4, transistors MOS may be utilized alternatively.

What is claimed is:

1. Variable gain amplifier comprising a first device to which a first control signal is applied so that a gain of an output signal of said first device with respect to a first input signal is a function of an exponential type of said first control signal, the amplifier including a feedback network sensitive only to a common mode signal and connected between an output terminal and an input terminal of said first device so as to assure that said gain in decibel of said first device is a linear function of said first control signal.

2. Amplifier according to claim 1, wherein said feedback network comprises:
   first means able to extract a first continuous component from said output signal of said first device;
   second means able to extract a second continuous component from an output signal of said feedback network;
   an operational amplifier that has in input a signal given by a difference between said first and said second continuous components; and
   a second device to which a second control signal is applied in such a way that a gain of an output signal of said second device with respect to a second input signal is a function of an exponential type of said second control signal, said second control signal being an output signal of said operational amplifier, said output signal of said second device being said output signal of said feedback network which added to said second input signal forms said first input signal of said first device.

3. Amplifier according to claim 2, wherein said first device is a current divider, said current divider comprising at least two transistors arranged in differential configuration, and said first control signal being applied between drivable terminals of said transistors.

4. Amplifier according to claim 2, wherein said second device is a current divider, said current divider comprising at least two transistors arranged in differential configuration, and said second control signal being applied between drivable terminals of said transistors.

5. Amplifier according to claim 3, wherein said transistors are npn bipolar transistors, said bipolar transistors having emitter terminals in common and having at least one collector terminal connected with a supply voltage and said drivable terminals being base terminals.

6. Amplifier according to claim 2, further comprising:
   a voltage/current converter adapted to convert a voltage signal in input to said amplifier into a current signal in input to said first device which correspond to said second input signal; and
   a current/voltage converter that has in input said output signal of said second device and is adapted to determine a voltage signal in output from said amplifier.

7. Amplifier according to claim 4, wherein said transistors are npn bipolar transistors, said bipolar transistors having emitter terminals in common and having at least one collector terminal connected with a supply voltage and said drivable terminals being base terminals.

8. Amplifier according to claim 4, wherein said first and second means comprise low pass filters.

9. Amplifier according to claim 3, wherein said transistors comprise metal oxide semiconductor (MOS) transistors.

10. An apparatus, comprising:
    a first device coupled to receive a first control signal, the first device being coupled to generate an output signal whose gain with respect to a first input signal to the first device is an exponential function of the first control signal; and
    a feedback network coupled to an output terminal of the first device to receive at least some of the output signal from the first device and coupled to an input terminal of the first device to provide an output current derived from the output signal as part of the first input signal to the first device, the feedback network being sensitive only to a common mode signal and being coupled to the first device in a manner that a decibel gain of the first device is a linear function of the first control signal.

11. The apparatus of claim 10 wherein the feedback network comprises:
   a first circuit block coupled to the output terminal of the first device to extract a bias component from the output signal of the first device;
   a second circuit block coupled to the input terminal of the first device to extract a signal component from the output current;
   an operational amplifier coupled to the first and second circuit blocks to receive an input comprising a difference between the bias component and the signal component; and
   a second device coupled to the operational amplifier to receive an output signal of the operational amplifier as a second control signal in a manner that a gain of the second device is a function of an exponential type of the second control signal.

12. The apparatus of claim 10 wherein the first device comprises a current divider including transistors arranged in a differential configuration to receive the first control signal at drivable terminals of the transistors.

13. The apparatus of claim 11 wherein the second device comprises a current divider including transistors arranged in a differential configuration to receive the second control signal at drivable terminals of the transistors.

14. The apparatus of claim 10 wherein the feedback network comprises:
   a first transistor group arranged in a differential configuration;
   a second transistor group arranged in a differential configuration; and
   an operational amplifier having an output terminal coupled to common terminals of some of the transistors from the first and from the second transistor groups, a first input terminal coupled to other terminals of some of the transistors from the first and from the second transistor groups, and a second input terminal to detect a common mode voltage.

15. A method, comprising:
   applying a first control signal to a first device;
   providing a first input signal to the first device and generating an output signal from the first device having a gain, relative to the first input signal, that is an exponential function of the first control signal; and
   deriving a feedback signal from the output signal and feeding back the feedback signal, from a feedback network sensitive only to a common mode signal to the first device, in a manner that a decibel gain of the first device is a linear function of the first control signal.

16. The method of claim 15 wherein deriving the feedback signal from the output signal includes:
   extracting a first continuous component from the output signal of the first device;
   extracting a second continuous component from an output signal of a second device;
   obtaining a difference between the first and second continuous components and generating an output therefrom; and
   applying a second control signal, comprising the generated output, to the second device in a manner that a gain of the second device, relative to a second input signal to the second device, is an exponential function of the second control signal.

17. The method of claim 16, further comprising adding the output signal of the second device to the second input signal to obtain the first input signal to the first device.

18. A variable gain amplifier, comprising:
   a first device to which a first control signal is applied so that a gain of an output signal of said first device with respect to a first input signal is a function of an exponential type of said first control signal; and
   a feedback network connected between an output terminal and an input terminal of said first device so as to assure that said gain in decibel of said first device is a linear function of said first control signal, wherein said feedback network includes:
      first means able to extract a first continuous component from said output signal of said first device;
      second means able to extract a second continuous component from an output signal of said feedback network;
      an operational amplifier that has in input a signal given by a difference between said first and said second continuous components; and
      a second device to which a second control signal is applied in such a way that a gain of an output signal of said second device with respect to a second input signal is a function of an exponential type of said second control signal, said second control signal being an output signal of said operational amplifier, said output signal of said second device being said output signal of said feedback network which added to said second input signal forms said first input signal of said first device.

19. The amplifier according to claim 18 wherein said first device is a current divider, said current divider comprising at least two transistors arranged in differential configuration, and said first control signal being applied between drivable terminals of said transistors.

20. The amplifier according to claim 18 wherein said second device is a current divider, said current divider comprising at least two transistors arranged in differential configuration, and said second control signal being applied between drivable terminals of said transistors.

21. The amplifier according to claim 18, further comprising:
   a voltage/current converter adapted to convert a voltage signal in input to said amplifier into a current signal in input to said first device which correspond to said second input signal; and
   a current/voltage converter that has in input said output signal of said second device and is adapted to determine a voltage signal in output from said amplifier.

22. An apparatus, comprising:
   a first device coupled to receive a first control signal, the first device being coupled to generate an output signal whose gain with respect to a first input signal to the first device is an exponential function of the first control signal; and
   a feedback network coupled to an output terminal of the first device to receive at least some of the output signal from the first device and coupled to an input terminal of the first device to provide an output current derived from the output signal as part of the first input signal to the first device, the feedback network being coupled to the first device in a manner that a decibel gain of the first device is a linear function of the first control signal, wherein the feedback network includes:
      a first circuit block coupled to the output terminal of the first device to extract a bias component from the output signal of the first device;
      a second circuit block coupled to the input terminal of the first device to extract a signal component from the output current;

an operational amplifier coupled to the first and second circuit blocks to receive an input comprising a difference between the bias component and the signal component; and a second device coupled to the operational amplifier to receive an output signal of the operational amplifier as a second control signal in a manner that a gain of the second device is a function of an exponential type of the second control signal.

23. The apparatus of claim 22 wherein the second device comprises a current divider including transistors arranged in a differential configuration to receive the second control signal at drivable terminals of the transistors.

24. An apparatus, comprising:

a first device coupled to receive a first control signal, the first device being coupled to generate an output signal whose gain with respect to a first input signal to the first device is an exponential function of the first control signal; and a feedback network coupled to an output terminal of the first device to receive at least some of the output signal from the first device and coupled to an input terminal of the first device to provide an output current derived from the output signal as part of the first input signal to the first device, the feedback network being coupled to the first device in a manner that a decibel gain of the first device is a linear function of the first control signal, wherein the feedback network includes:

a first transistor group arranged in a differential configuration;

a second transistor group arranged in a differential configuration; and an operational amplifier having an output terminal coupled to common terminals of some of the transistors from the first and from the second transistor groups, a first input terminal coupled to other terminals of some of the transistors from the first and from the second transistor groups, and a second input terminal to detect a common mode voltage.

25. A method, comprising:

applying a first control signal to a first device;

providing a first input signal to the first device and generating an output signal from the first device having a gain, relative to the first input signal, that is an exponential function of the first control signal; and deriving a feedback signal from the output signal and feeding back the feedback signal to the first device in a manner that a decibel gain of the first device is a linear function of the first control signal, wherein deriving the feedback signal from the output signal includes:

extracting a first continuous component from the output signal of the first device;

extracting a second continuous component from an output signal of a second device;

obtaining a difference between the first and second continuous components and generating an output therefrom; and applying a second control signal, comprising the generated output, to the second device in a manner that a gain of the second device, relative to a second input signal to the second device, is an exponential function of the second control signal.

26. The method of claim 25, further comprising adding the output signal of the second device to the second input signal to obtain the first input signal to the first device.

* * * * *